(12) United States Patent
Kataoka

(10) Patent No.: US 6,320,404 B1
(45) Date of Patent: Nov. 20, 2001

(54) DEFECTIVE POWER SOURCE DETECTION METHOD AND APPARATUS OF POWER SOURCE SUPPLY SYSTEM

(75) Inventor: Keiju Kataoka, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/559,882

(22) Filed: Apr. 26, 2000

(30) Foreign Application Priority Data

Apr. 28, 1999 (JP) .................................................. 11-123227

(51) Int. Cl.[7] .................................................. G01R 31/36
(52) U.S. Cl. ............................. 324/771; 340/635; 340/645
(58) Field of Search .................................. 324/771, 618, 324/433, 522, 705, 677, 678, 713, 426; 320/106, 112, 118, 135; 340/635, 645, 653, 654

(56) References Cited

U.S. PATENT DOCUMENTS 6,118,295 * 9/2000 Murayama et al. .................. 324/771
6,236,226 * 5/2001 Hagiwara .............................. 324/771

* cited by examiner

Primary Examiner—Ernest Karlsen
Assistant Examiner—Minh Tang
(74) Attorney, Agent, or Firm—Fish & Richardson PC

(57) ABSTRACT

The defective power source detecting apparatus of a power source supply system has: an output voltage monitoring circuit 16-1 to 16-N for monitoring the DC voltage on an output end of the rectifier circuit which is an output end of each power source apparatus, and for outputting a defect detecting signal to show that the defective state occurs, when the output of the rectifier circuit is abnormal; an inverter output monitoring circuit 18-1 to 18-N for monitoring an inverter output of each power supply apparatus, and for outputting a defect detecting signal to show that the defective state occurs, when the output of the inverter is abnormal; and a control circuit 50 for fetching the monitoring outputs of the output voltage monitoring means and the inverter output monitoring means, and for judging the power source apparatus corresponding to the case in which the outputs of the rectifier circuit and the inverter are abnormal, to be defective.

6 Claims, 3 Drawing Sheets

DEFECTIVE POWER SOURCE DETECTION METHOD AND APPARATUS OF POWER SOURCE SUPPLY SYSTEM

BACKGROUND OF THE INVENTION

1. Field of the Invention

The present invention relates to a defective power source detection method and apparatus for a power source supply system structured by including a plurality of power source apparatus to supply the power source voltage to an apparatus requiring the large power such as a semiconductor testing apparatus.

2. Description of the Related Art

By taking a semiconductor testing apparatus as an example of an apparatus requiring a power source with the large power, the structure of a power source supply system for the semiconductor testing apparatus will be shown in FIG. 4. In FIG. 4, the power source supply system has: a power source apparatus 200-1, 200-2, . . . , and 200-N; a defect detecting circuit 210 to detect the defective state of each of power source apparatus 200-1, 200-2, . . . , and 200-N, and to control start/stop of each of power source apparatus corresponding to the detection result; and a control circuit 220 to control the operation of the defect detecting circuit 210.

Numerals 100A and 100B are power source supply lines of the semiconductor testing apparatus, and output ends of each of power source apparatus 200-1, 200-2, . . . , and 200-N are connected to the power source supply lines 100A and 100B, so that the power source voltage is supplied by operating a plurality of power source apparatus 200-1, 200-2, . . . , and 200-N in parallel.

The power source apparatus 200-1 has an inverter 202-1 and a rectifying and smoothing circuit 204-1, and the output ends of the rectifying and smoothing circuit 204-1, that is, the output ends of the power source apparatus 200-1 are connected to the power source supply lines 100A and 100B. Further, the output voltage of the rectifying and smoothing circuit 204-1 is monitored by an output voltage monitoring circuit 206-1 which is housed in the power source apparatus 200-1. The structure of each of power source apparatus 200-2 to 200N is the same as that of the power source apparatus 200-1.

The defect detecting circuit 210 has a gate 212 to fetch the monitoring voltage (the output voltage of the rectifying and smoothing circuit) of the output voltage monitoring circuits 206-1 to 206-N, which are housed in the power source apparatus 200-2 to 200-N, a latch circuit 214 to hold the output of the gate 212, an OR gate 215, a gate 216 to fetch the output of the latch circuit 214 in the control circuit 220, and the power source start/stop circuit 218.

In the above structure, the output voltage monitoring circuits 206-1 to 206-N of the power source apparatus 200-1, 200-2, . . . , and 200-N, monitor the same voltage in the power source supply lines 100A and 100B. In this state, when a defect is generated in the specified power source apparatus, for example, the power source apparatus 200-1, the voltage level in the power source supply lines 100A and 100B is changed. Each of the output voltage monitoring circuits 206-1 to 206-N compares the reference voltage being provided therein with monitoring voltage in the power source supply lines 100A and 100B, and according to the result of the comparison, outputs a defect detecting signal. Because the output voltage monitoring circuits 206-1 to 206-N monitor the same voltage in the power source supply lines 100A and 100B, the defect detecting signal is outputted from each of output voltage monitoring circuits 206-1 to 206-N to the defect detection circuit 210, and is held in the latch circuit 214 through the gate 212.

The timing of the latching of the defect detecting signal in the latch circuit 214, is the timing at which the first defect detecting signal of a plurality of defect detecting signals outputted from the output voltage monitoring circuits 206-1 to 206-N, is inputted into the latch circuit 214. Incidentally, a plurality of defect detecting signals outputted from the output voltage monitoring circuits 206-1 to 206-N are not necessarily defect detecting signals outputted from the defective power source apparatus because the difference of time is generated in the input timing in the latch circuit 214 due to fluctuations of the characteristics of the elements constituting each output voltage monitoring circuit.

Further, the control circuit 220 generates a reading signal to confirm the existence or not of the defect detecting signal, periodically, and when the defect detecting signal is confirmed, outputs a power source stop command to the power source start/stop circuit 218 in the defect detection circuit 210. The defect detection circuit 210 outputs a power source stop signal to stop the power source supply to each power source apparatus 200-1, 200-2, . . . , and 200-N, according to either one of the power source stop signal from the control circuit 220, or an OR output of the defect detecting signal outputted from the OR gate 215. After the power of each of power source apparatus 200-1, 200-2, . . . , and 200-N is stopped, the defective power source apparatus (in this example, the power source apparatus 200-1) is replaced.

In the above conventional power source supply system, after the power of each of power source apparatus 200-1, 200-2, . . . , and 200-N is stopped, the defective power source apparatus is replaced, however, because the defect detecting signal held in the latch circuit inverter 214 not necessarily corresponds to the output of the defective power source apparatus, the power source apparatus which is in the defective state, can not be accurately specified. Accordingly, in the worst case, because it is necessary that the power source apparatus is replaced several times, there is a problem that a long period of time is necessary for the replacement operation of the defective power source apparatus.

SUMMARY OF THE INVENTION

The present invention is attained in view of such the circumstance, and an object of the present invention is to provide a defective power source detecting method and apparatus of the power source supply system by which a defective power source can be easily specified when a plurality of power source apparatus are operated in parallel.

In order to attain the above object, in the first aspect of the invention, a defective power source detecting method of a power source supply system to detect a defective state of a plurality of power source apparatus in a power source supply system in which the plurality of power source apparatus having an inverter and a rectifier circuit to convert an inverter output into the DC voltage, are operated in parallel and supply the DC voltage to a power source supply line of an apparatus requiring the large power, the defective power source detecting method of a power source supply system is characterized in that: the DC voltage on an output end of the rectifier circuit which is an output end of each power source apparatus connected to the power source supply line, is monitored, and an inverter output of each power source apparatus is also monitored, and when both of the DC voltage on an output end of the rectifier circuit and the inverter output are -abnormal, it is judged that the power source apparatus corresponding to this state is defective.

According to the invention described in the first aspect, the DC voltage on an output end of the rectifier circuit which is an output end of each power source apparatus connected to the power source supply line, is monitored, and an inverter output of each power source apparatus is also monitored, and because when both of the DC voltage on an output end of the rectifier circuit and the inverter output are abnormal, it is judged that the power source apparatus corresponding to this state is defective, thereby, a defective power source apparatus can be easily specified when a plurality of power source apparatus are operated in parallel, and a time period necessary for the replacement operation of the defective power source apparatus can be reduced.

Further, in the invention described in the second aspect, a defective power source detecting apparatus of a power source supply system to detect a defective state of a plurality of power source apparatus in a power source supply system, in which the plurality of power source apparatus having an inverter and a rectifier circuit to convert an inverter output into the DC voltage, are operated in parallel and supply the DC voltage to a power source supply line of an apparatus requiring the large power, the defective power source detecting apparatus of a power source supply system comprises: an output voltage monitoring means for monitoring the DC voltage on an output end of the rectifier circuit which is an output end of each power source apparatus, and for outputting a defect detecting signal to show that the defective state occurs, when the output of the rectifier circuit is abnormal; an inverter output monitoring means for monitoring an inverter output of each power supply apparatus, and for outputting a defect detecting signal to show that the defective state occurs, when the output of the inverter is abnormal; and a judgement means for fetching the monitoring outputs of the output voltage monitoring means and the inverter output monitoring means, and for judging the power source apparatus corresponding to the case in which the outputs of the rectifier circuit and the inverter are abnormal, to be defective.

According to the invention described in the second aspect, in a defective power source detecting apparatus of a power source supply system to detect a defective state of a plurality of power source apparatus in a power source supply system in which the plurality of power source apparatus having an inverter and a rectifier circuit to convert an inverter output into the DC voltage, are operated in parallel and supply the DC voltage to a power source supply line of an apparatus requiring the large power, because the defective power source detecting apparatus of a power source supply system comprises: an output voltage monitoring means for monitoring the DC voltage on an output end of the rectifier circuit which is an output end of each power source apparatus, and for outputting a defect detecting signal to show that the defective state occurs, when the output of the rectifier circuit is abnormal; an inverter output monitoring means for monitoring an inverter output of each power supply apparatus, and for outputting a defect detecting signal to show that the defective state occurs, when the output of the inverter is abnormal; and a judgement means for fetching the monitoring outputs of the output voltage monitoring means and the inverter output monitoring means, and for judging the power source apparatus corresponding to the case in which the outputs of the rectifier circuit and the inverter are abnormal, to be defective, thereby, a defective power source apparatus can be easily specified when a plurality of power source apparatus are operated in parallel, and the time period necessary for the replacement operation of the defective power source apparatus can be reduced.

The invention described in the third aspect is characterized in that, in the defect detecting apparatus of the power source supply system described in the second aspect, an apparatus requiring the large power is a semiconductor testing apparatus.

According to the invention described in the third aspect, a defective power source apparatus can be easily specified when a plurality of power source apparatus which supply the power source in the power source supply line of the semiconductor testing apparatus, are operated in parallel, and the time period necessary for the replacement operation of the defective power source apparatus can be reduced.

DETAILED DESCRIPTION OF THE PRESENT INVENTION

Figure 1:
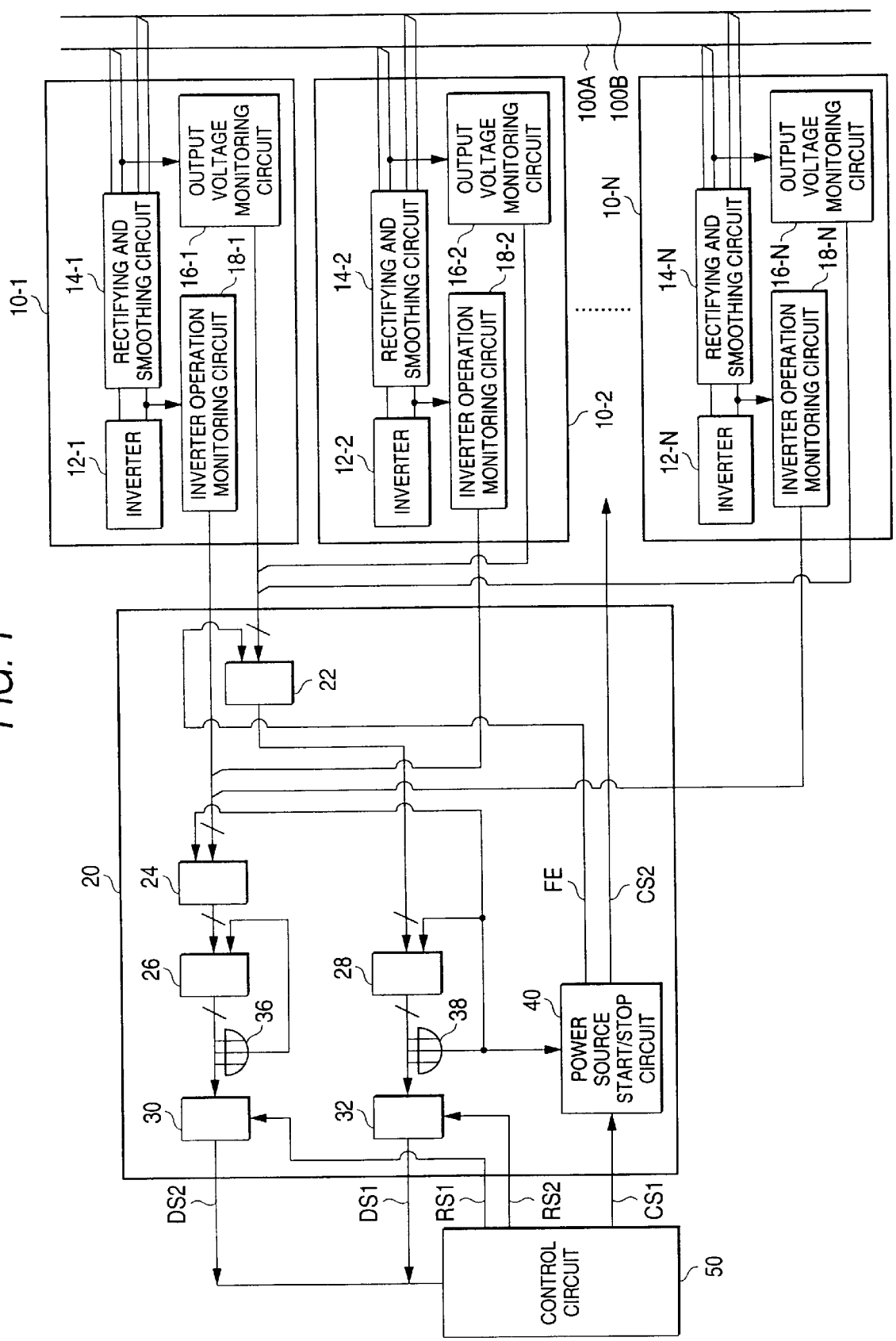
FIG. 1 is a block diagram showing the structure of a defective power source detecting apparatus of a power source supply system according to the embodiment of the present invention.

Referring to the drawings, an embodiment of the present invention will be detailed below. The structure of a defective power source detecting apparatus of a power source supply system according to the embodiment of the present invention will be shown in FIG. 1. This defective power source detecting apparatus is an apparatus to carry out a defective power source detecting method in the power source supply system, in which the plurality of power source apparatus having an inverter and a rectifier circuit to convert an inverter output into the DC voltage, are operated in parallel and supply the DC voltage to a power source supply line of an apparatus requiring the large power, the defective power source detecting method of a power source supply system is characterized in that: the DC voltage on an output end of the rectifier circuit which is an output end of each power source apparatus connected to the power source supply line, is monitored, and an inverter output of each power source apparatus is also monitored, and when both of the DC voltage on an output end of the rectifier circuit and the inverter output are abnormal, it is judged that the power source apparatus corresponding to this state is defective.

In FIG. 1, the power source supply system detects the power source apparatus 10-1, 10-2, . . . , and 10-N the defective state of each of the power source apparatus 10-1, 10-2, . . . , and 10-N, and has a defect detecting circuit 20 to control the start/stop of each of power source apparatus corresponding to the detection result, and a control circuit to control the operation of the defect detecting circuit 20. In order to supply the large power, the output ends of the power source apparatus 10-1, 10-2, . . . , and 10-N are connected in parallel to the power source supply lines 100A and 100B of the semiconductor testing apparatus.

The power source apparatus 10-1 has the inverter 12-1 and the rectifying and smoothing circuit 14-1, and the output end of the rectifying and smoothing circuit 14-1, that is, the output terminals of the power source apparatus 10-1 are connected to the power source supply lines 100A and 100B. Further, the output voltage of the rectifying and smoothing circuit 14-1 is monitored by an output voltage monitoring circuit 16-1 housed in the power source apparatus 10-1, and the output voltage of the inverter 12-1 is monitored by an inverter operation monitoring circuit 18-1. The structure of each of power source apparatus 10-2 to 10-N, is also the same as that of the power source apparatus 10-1.

The defect detecting circuit 20 has: a gate 22 which fetches judgement signals of the monitoring voltage (the output voltage of the rectifying and smoothing circuit) of the output monitoring circuits 16-1 to 16-N housed in each of power source apparatus 10-1, 10-2, . . . , and 10-N; a gate 24 which fetches judgement signals of the monitoring voltage (the output voltage of the inverter) of the inverter operation monitoring circuit 18-1, 18-2, . . . , and 18-N; a latch circuit 26 holding the output of the gate 24; a latch circuit 28 holding the output of the gate 22; an OR gate 36 which operates the logical add of the latch circuit 26; an OR gate 38 which operates the logical add of the latch circuit 28; a gate 30 which fetches the output of the latch circuit 26 into the control circuit 50; a gate 32 which fetches the output of the latch circuit 28 into the control circuit 50; and a power source start/stop circuit 40 to output the start/stop signal to each of power source apparatus 10-1, 10-2, . . . , and 10-N according to the output of the OR gate 38 or the output of the control circuit 50.

The power source start/stop circuit 40 outputs a control signal FE which makes the operation of the gate 22 effective, to the gate 22. The control signal FE is outputted only during the operation of the power source apparatus 10-1, 10-2, . . . , and 10-N, and the gate 22 passes the input signal only while the control signal is inputted.

Figure 2:
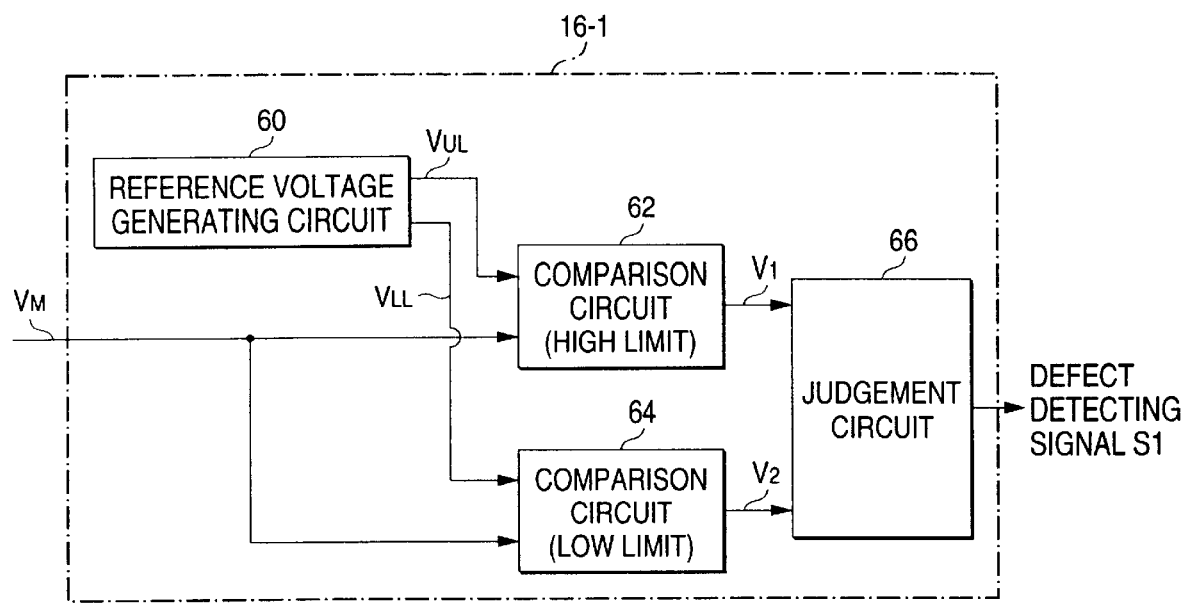
FIG. 2 is a block diagram showing the concrete structure of an output voltage monitoring circuit in FIG. 1.

Next, the specific structure of the output voltage monitoring circuit 16-1 is shown in FIG. 2. In FIG. 2, the output voltage monitoring circuit 16-1 has: a reference voltage generation circuit 60 to generate an upper limit reference voltage VUL, and a lower limit reference voltage VLL, by which a upper limit and a lower limit of the output of the power source apparatus are regulated; a comparison circuit 62 to compare a monitoring output VM, which is the output voltage of the rectifying and smoothing circuit 14-1, with the upper limit reference voltage VUL; a comparison circuit 64 to compare the monitoring output VM with the lower limit reference voltage VLL; and a judgement circuit 66 to output a defect detecting signal S1 when the monitoring output VM is out of the range of the voltage value regulated by the upper limit reference voltage VUL and the lower limit reference voltage VLL, according to the comparison output of the comparison circuits 62 and 64.

Figure 3:
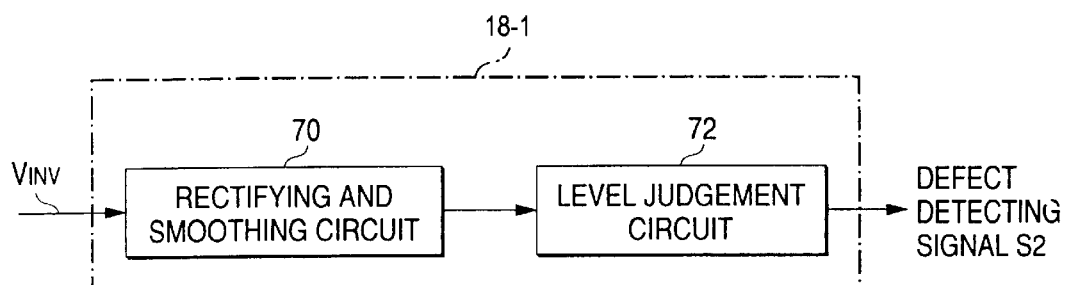
FIG. 3 is a block diagram showing the concrete structure of an inverter operation monitoring circuit in FIG. 1.
Figure 4:
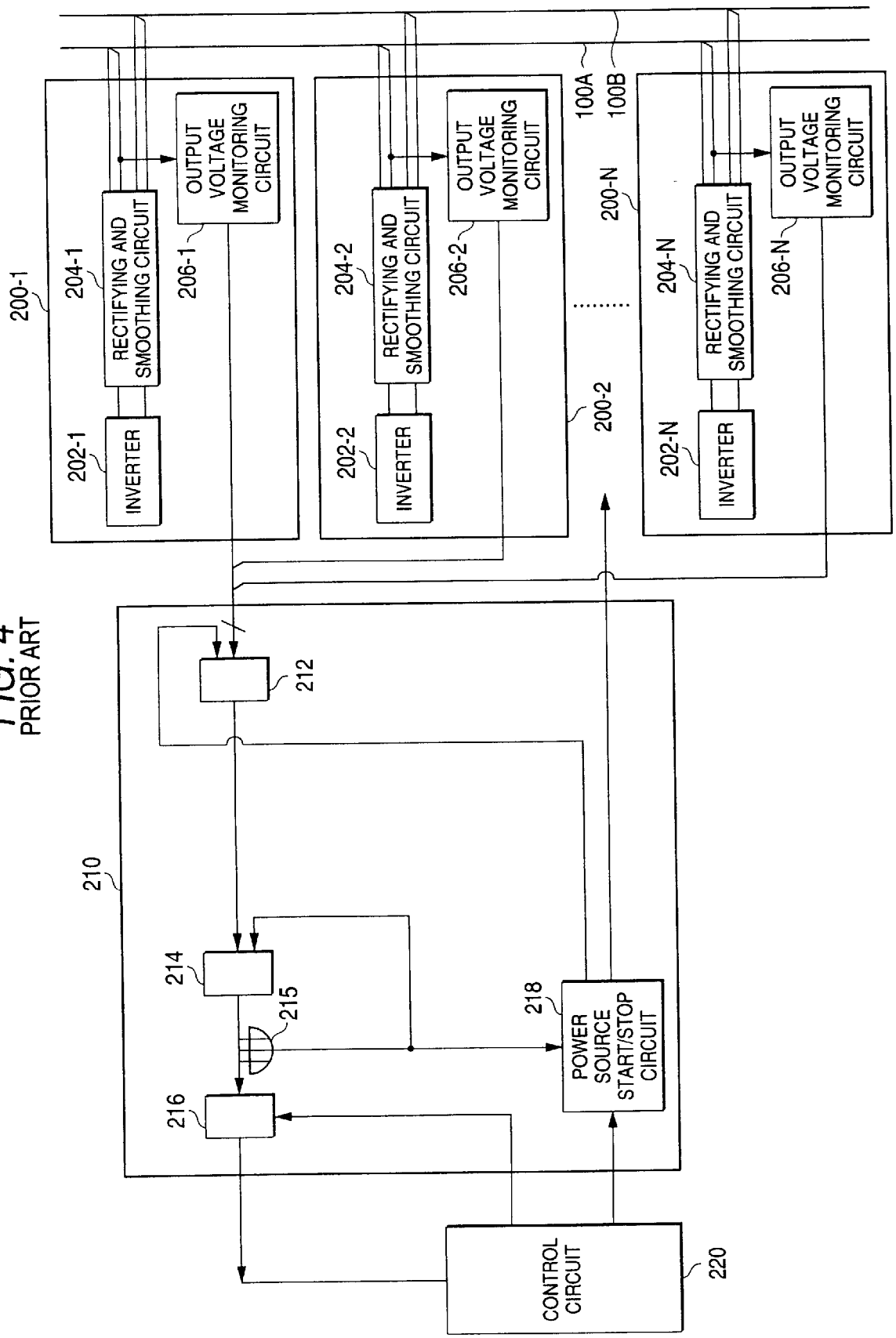
FIG. 4 is a block diagram showing the structure of the conventional defective power source detecting apparatus of the power source supply system.

Next, the specific structure of the inverter operation monitoring circuit 18-1 is shown in FIG. 3. In FIG. 3, the inverter operation monitoring circuit 18-1 has: a rectifying and smoothing circuit 70 to rectify the inverter output VINV and to convert it into the DC voltage; and a level judgement circuit 72 to output a defect detecting signal S2 when the level of the output voltage of the rectifying and smoothing circuit 70 is compared to the reference level, and the level of the output voltage of the rectifying and smoothing circuit 70 is out of a predetermined range.

In the above structure, the output voltage monitoring circuits 16-1 to 16-N monitor the same voltage in the power source supply lines 100A and 100B. In this state, when the defect occurs in any of the power source apparatus 10-1, 10-2, . . . , and 10-N (for example, the power source apparatus 10-1), the voltage level of the monitoring voltage VM in the power source supply lines 100A and 100B changes, and becomes the abnormal voltage. In the output voltage monitoring circuit 16-1, the monitoring voltage VM and the upper limit reference voltage VUL are compared in the comparison circuit 62, and the monitoring voltage VM and the lower limit reference voltage VLL are respectively compared in the comparison circuit 64, and signals V1 and V2 showing the comparison results are respectively outputted to the judgement circuit 66.

The judgement circuit 66 outputs a defect detecting signal S1 to the gate 22 in the defect detecting circuit 20 when the monitoring output VM is judged to be out of the range regulated by the upper limit reference voltage VUL and the lower limit reference voltage VLL, according to the comparison outputs Vi and V2 of the comparison circuits 62 and 64. The output voltage monitoring circuit 16-2 to 16-N are also operated in the same manner as the output voltage monitoring circuit 16-1, and output the defect detecting signal S1 to the gate 22. Accordingly, the defect detecting signal S1 outputted from the output voltage monitoring circuit 16-2 to 16-N is inputted into the latch circuit 28 through the gate 22 by the control signal FE outputted from the power source start/stop circuit 40, and in the latch circuit 28, the defect detecting signal S1 is held by the output of the OR gate 38. The defect detecting signal S1 held by the latch circuit 28 is called the defect detection data DS1.

Herein, the output of the OR gate 38 (latch signal) is the logical add of the output of the latch circuit 28, and so far as the defect detecting signal S1 is not inputted into the latch circuit 28, the latch operation of the latch circuit 28 is not conducted. Further, because the output of the OR gate 38 is also used as the control signal to control the gate operation of the gate 24, so far as the defect detecting signal S1 is not inputted into the latch circuit 28, the gate 24 is not activated.

On the one hand, in the inverter operation monitoring circuits 18-1 to 18-N, the output VM of the inverters 12-1 to 12-N is monitored. The inverter operation monitoring circuit 18-1 will be described below. The inverter operation monitoring circuit 18-1 converts the output voltage of the output transformer of the inverter into the DC voltage by the rectifying and smoothing circuit 70, and judges the output of the rectifying and smoothing circuit 70, whether it is normal or not, by the comparison with the reference level by the level judgement circuit 72. The inverter operation monitoring circuits 18-2 to 18-N are also operated in the same manner.

Herein, in the inverter operation monitoring circuit, when the abnormality occurs in the output of the output transformer of the inverter, the defect detecting signal S2 is outputted from the level judgement circuit to the gate 24 of the defect detecting circuit 20. In this manner, because the inverter operation monitoring circuits 18-1 to 18-N have the function to confirm the output of the inverter of each of the power source apparatus 10-1, 10-2, . . . , and 10-N, the defect detecting signal S2 is outputted only from the power source apparatus in which the abnormality occurs. In the present embodiment, because the output of the inverter 12-1 of the power source apparatus 10-1 is abnormal, the defect detecting signal S2 is outputted only from the inverter operation monitoring circuit 18-1, and outputted to the gate 24 in the defect detecting circuit 20.

The gate 24 passes the defect detecting signal S2 only while the latch signal outputted from the OR gate 38 is outputted. Accordingly, so far as the defect detecting signal S1 does not occur, the defect detecting signal S2 inputted into the gate 24 is not effective. The defect detecting signal S2 is inputted into the latch circuit 26 through the gate 24, and the output of the OR gate 36 is held in the latch circuit 26 as the latch signal. The defect detecting signal S2 held in the latch circuit 26 is called the defect detection data DS2.

The control circuit 50 outputs reading signals RS1 and RS2 to gates 30 and 32 to confirm the existence of the defect detecting data DS1 and DS2 at a constant period. These reading signals RS1 and RS2 are control signals of the gate, and the gates 30 and 32 pass the data only while these signals are outputted.

The control circuit 50 fetches the defect detecting data DS1 and DS2 through the gates 32 and 30, and according to these defect detecting data DS1 and DS2, specifies the power source apparatus (in the present embodiment, the power source apparatus 10-1) which is defective, and displays the data specifying the power source apparatus on a display section, not shown.

Further, the control circuit 50 outputs a command CS1 to stop the operation of the power source apparatus 10-1 to 10-N to the power source start/stop circuit 40 according to the defect detecting data DS1 and DS2. In the defect detecting circuit 20, the power source start/stop circuit 40 receives the command CS1 from the control circuit 50, and outputs the control signal CS2 to stop the operation of each of the power source apparatus 10-1 to 10-N, to each of the power source apparatus 10-1 to 10-N. After that, when the power source apparatus 10-1 which is the defective power source apparatus, is replaced with the power source apparatus which operates normally, the parallel operation of a plurality of power source apparatus can be conducted.

As described above, according to the defective power source detecting method of the power source supply system according to the embodiment of the present invention, because the DC voltage on an output end of the rectifier circuit which is an output end of each power source apparatus connected to the power source supply line, is monitored, and an inverter output of each power source apparatus is also monitored, and when both of the DC voltage on an output end of the rectifier circuit and the inverter output are abnormal, it is judged that the power source apparatus corresponding to this state is defective, thereby, the defective power source apparatus can be easily specified when a plurality of power source apparatus are operated in parallel, and a time period necessary for the replacement operation of the defective power source apparatus can be reduced.

Further, according to the defective power source detecting method of the power source supply system according to the embodiment of the present invention, in a defective power source detecting apparatus of a power source supply system to detect a defective state of a plurality of power source apparatus, in a power source supply system in which the plurality of power source apparatus 10-1 to 10-N having an inverter and a rectifier circuit to convert an inverter output into the DC voltage, are operated in parallel and supply the power source to a power source supply line of an apparatus requiring the large power, the defective power source detecting apparatus of a power source supply system comprises: an output voltage monitoring circuit 16-1 to 16-N for monitoring the DC voltage on an output end of the rectifier circuit which is an output end of each power source apparatus, and for outputting a defect detecting signal to show that the defective state occurs, when the output of the rectifier circuit is abnormal; an inverter operation monitoring circuit 18-1 to 18-N for monitoring an inverter output of each power supply apparatus, and for outputting a defect detecting signal to show that the defective state occurs, when the output of the inverter is abnormal; and a control circuit 50 for fetching the monitoring outputs of the output voltage monitoring means and the inverter output monitoring means, and for judging the power source apparatus corresponding to the case in which the outputs of the rectifier circuit and the inverter are abnormal, to be defective, thereby, a defective power source apparatus can be easily specified when a plurality of power source apparatus are operated in parallel, and a time period necessary for the replacement operation of the defective power source apparatus can be reduced.

According to the defective power source detecting method of the power source supply system according to the embodiment of the present invention, because the present invention is applied to the semiconductor testing apparatus, when a plurality of power source apparatus to supply the power source to the power source supply line of the semiconductor testing apparatus is operated in parallel, the defective power source can be easily specified, and a time period necessary for the replacement operation of the defective power source can be reduced.

Incidentally, the output voltage monitoring circuits 16-1 to 16-N correspond to the output voltage monitoring means of the present invention, the inverter operation monitoring circuits 18-1 to 18-N correspond to the inverter output monitoring means of the present invention, and the control circuit 50 corresponds to the judgement means of the present invention respectively.

As described above, according to the invention described in the first aspect, because the DC voltage on an output end of the rectifier circuit which is an output end of each power source apparatus connected to the power source supply line, is monitored, and an inverter output of each power source apparatus is also monitored, and when both of the DC voltage on an output end of the rectifier circuit and the inverter output are abnormal, it is judged that the power source apparatus corresponding to this state is defective, thereby, the defective power source apparatus can be easily specified when a plurality of power source apparatus are operated in parallel, and a time period necessary for the replacement operation of the defective power source apparatus can be reduced Further, according to the invention described in the second aspect, in a defective power source detecting apparatus of a power source supply system to detect a defective state of a plurality of power source apparatus, in a power source supply system in which the plurality of power source apparatus having an inverter and a rectifier circuit to convert an inverter output into the DC voltage, are operated in parallel and supply the power source to a power source supply line of an apparatus requiring the large power, the defective power source detecting apparatus of a power source supply system comprises: an output voltage monitoring means for monitoring the DC voltage on an output end of the rectifier circuit which is an output end of each power source apparatus, and for outputting a defect detecting signal to show that the defective state occurs, when the output of the rectifier circuit is abnormal; an inverter output monitoring means for monitoring an inverter output of each power supply apparatus, and for outputting a defect detecting signal to show that the defective state occurs, when the output of the inverter is abnormal; and a judgement means for fetching the monitoring outputs of the output voltage monitoring means and the inverter output monitoring means, and for judging the power source apparatus corresponding to the case in which the outputs of the rectifier circuit and the inverter are abnormal, to be defective, thereby, a defective power source apparatus can be easily specified when a plurality of power source apparatus are operated in parallel, and a time period necessary for the replacement operation of the defective power source apparatus can be reduced.

Further, according to the invention described in the third aspect, when a plurality of power source apparatus to supply the power source to the power source supply line of the semiconductor testing apparatus are operated in parallel, the defective power source apparatus can be easily specified, and a time period necessary for the replacement operation of the defective power source apparatus can be reduced.

What is claimed is:

1. A method of detecting a defective power source in a power source supply system for supplying a large DC voltage to an apparatus through a power supply line, the method comprising:

preparing a plurality of power sources connected in parallel to the power supply line, wherein each of the plurality of power sources includes an inverter and a rectifying circuit for converting an output of the inverter to a DC voltage;

monitoring an output being the DC voltage on an output end of each of the rectifier circuits connected to the power source supply line;

monitoring the output on an output end of each of the inverters; and judging that one of plurality of the power source is defective if both of the outputs of the inverter and the rectifying circuit in the one of the plurality of power sources are abnormal.

2. A defective power source detecting apparatus for a power source supply system, the defective power source detecting apparatus comprising:

a plurality of power sources for supplying a DC voltage to an apparatus requiring a large power through a power supply line, the plurality of power sources connected in parallel to the power supply line, each of the plurality of power sources having an inverter and a rectifier circuit for converting the inverter output into a DC voltage, an output voltage monitoring means for monitoring the DC voltage on an output end of the rectifier circuit which is an output end of each of the plurality of power sources, the output voltage monitoring means for outputting a defect detecting signal to show that the defective state occurs when the output of the rectifier circuit is abnormal;

an inverter output monitoring means for monitoring an inverter output of each of the plurality of power sources, the inverter output monitoring means for outputting a defect detecting signal to show that the defective state occurs when the output of the inverter is abnormal; and a judgement means into which the defect detecting signals of the output voltage monitoring means and the inverter output monitoring means in the plurality of power sources are input, the judgement means for judging that one of the plurality of the power sources is abnormal if both of the detecting signals of the rectifier circuit and the inverter in the one of the plurality of power sources are abnormal.

3. The defective power source detection apparatus according to claim 2, wherein the apparatus requiring the large power is a semiconductor testing apparatus.

4. The defective power source detection apparatus according to claim 2, wherein the output voltage monitoring means judges that the output of the output voltage monitoring means is abnormal if the output exceeds a predetermined upper limit reference voltage or the output is below a predetermined lower limit reference voltage.

5. The defecting power source detection apparatus according to claim 4, wherein the output voltage monitoring means comprises:

a reference voltage generation circuit for generating the predetermined lower limit reference voltage and the predetermined upper limit reference voltage;

a comparing means for comparing the output of the output voltage monitoring means with the lower limit reference voltage and the upper limit reference voltage; and a judging means for judging whether the output of the output voltage monitoring means is abnormal.

6. The defective power source detection apparatus according to claim 2, wherein the inverter output monitoring means judges the output of the inverter output monitoring means is abnormal if the output is out of a predetermined range.

* * * * *